US012509598B2

(12) United States Patent
Pang et al.

(10) Patent No.: US 12,509,598 B2
(45) Date of Patent: Dec. 30, 2025

(54) PROCESS SOLUTION COMPOSITION FOR POLYMER TREATMENT COMPRISING A FLUORINE COMPOUND, A KETONE SOLVENT, AND A POLAR APROTIC SOLVENT

(71) Applicant: DONGWOO FINE-CHEM CO., LTD., Jeollabuk-do (KR)

(72) Inventors: Soon-Hong Pang, Jeollabuk-do (KR); Han-Byeol Kang, Gyeonggi-do (KR); Sung-Sik Kim, Jeollabuk-do (KR); Tae-Hee Kim, Jeollabuk-do (KR)

(73) Assignee: DONGWOO FINE-CHEM CO., LTD., Jelloabuk-do (KR)

( * ) Notice: Subject to any disclaimer, the term of this patent is extended or adjusted under 35 U.S.C. 154(b) by 580 days.

(21) Appl. No.: 17/691,524

(22) Filed: Mar. 10, 2022

(65) Prior Publication Data
US 2022/0298366 A1 Sep. 22, 2022

(30) Foreign Application Priority Data

Mar. 16, 2021 (KR) .................. 10-2021-0033882

(51) Int. Cl.
C11D 3/43 (2006.01)
C09D 9/00 (2006.01)
C11D 3/24 (2006.01)
C11D 3/28 (2006.01)
C11D 3/30 (2006.01)
G03F 7/42 (2006.01)

(52) U.S. Cl.
CPC .............. C09D 9/005 (2013.01); C11D 3/245 (2013.01); C11D 3/28 (2013.01); C11D 3/30 (2013.01); G03F 7/425 (2013.01); C11D 2111/22 (2024.01)

(58) Field of Classification Search
CPC ......... C11D 3/32; C11D 3/2072; C11D 3/245; C11D 3/323; C11D 3/43; C11D 7/264; C11D 7/32; C11D 7/3236; C11D 7/5004; C11D 7/5013; C11D 7/5095; C11D 2111/22
See application file for complete search history.

(56) References Cited

U.S. PATENT DOCUMENTS

| 6,652,665 | B1 | 11/2003 | Sachdev et al. |
| 6,773,873 | B2 | 8/2004 | Seijo et al. |
| 6,818,608 | B2 | 11/2004 | Moore |
| 7,192,910 | B2 | 3/2007 | Wojtczak et al. |
| 8,802,608 | B2 | 8/2014 | Shimada et al. |
| 10,460,954 | B2 | 10/2019 | Cooper et al. |
| 11,175,585 | B2 | 11/2021 | Murayama et al. |
| 11,739,048 | B2 | 8/2023 | Pang et al. |
| 2005/0003977 | A1 | 1/2005 | Itano et al. |
| 2005/0014667 | A1 | 1/2005 | Aoyama et al. |
| 2005/0187118 | A1* | 8/2005 | Haraguchi ............... G03F 7/423 134/2 |
| 2006/0003910 | A1 | 1/2006 | Hsu et al. |
| 2006/0234516 | A1 | 10/2006 | Hong et al. |
| 2006/0237392 | A1 | 10/2006 | Auger et al. |
| 2007/0179072 | A1 | 8/2007 | Rao et al. |
| 2008/0004197 | A1 | 1/2008 | Kneer |
| 2009/0032766 | A1* | 2/2009 | Rajaratnam ......... H01L 29/6656 252/79.1 |
| 2009/0093107 | A1 | 4/2009 | Lee et al. |
| 2010/0163788 | A1 | 7/2010 | Visintin et al. |
| 2010/0197136 | A1 | 8/2010 | Shimada et al. |
| 2012/0181668 | A1* | 7/2012 | Doll ...................... H01L 31/068 438/746 |
| 2017/0200619 | A1 | 7/2017 | Cooper et al. |
| 2018/0230401 | A1 | 8/2018 | Sakanishi et al. |
| 2018/0265819 | A1 | 9/2018 | Kang et al. |
| 2019/0064672 | A1 | 2/2019 | Murayama et al. |
| 2020/0013618 | A1* | 1/2020 | Weng .................... G03F 7/0047 |
| 2020/0339523 | A1* | 10/2020 | Hoogboom ............... C23F 1/20 |
| 2022/0186152 | A1* | 6/2022 | Tanabe ................... C11D 7/267 |
| 2022/0195352 | A1 | 6/2022 | Sugo et al. |

FOREIGN PATENT DOCUMENTS

| CA | 2544209 | A1 | 5/2005 |
| CN | 1575331 | A | 2/2005 |
| CN | 1643454 | A | 7/2005 |
| CN | 101013273 | A | 8/2007 |
| CN | 103804980 | A | 5/2014 |
| CN | 108435101 | A | 8/2018 |
| CN | 109075035 | A | 12/2018 |
| EP | 1975987 | A2 | 10/2008 |
| JP | 2006009006 | A | 1/2006 |
| JP | 2006295118 | A | 10/2006 |
| JP | 2007027382 | A | 2/2007 |
| JP | 2009-194087 | A | 8/2009 |
| JP | 2009212383 | A | 9/2009 |
| JP | 2010515246 | A | 5/2010 |
| JP | 2017519862 | A | 7/2017 |
| JP | 2020189927 | A | 11/2020 |
| KR | 2003-0093974 | A | 12/2003 |
| KR | 10-2009-0096728 | A | 9/2009 |
| KR | 10-2010-0044777 | A | 4/2010 |
| KR | 10-2014-005994 | A | 5/2014 |

(Continued)

OTHER PUBLICATIONS

Shao, "Haiyang Fushi Yu Shengwu Wusun Fanghu Yanjiu", Jilin University Press, Mar. 2019.

Primary Examiner — Charles I Boyer
(74) Attorney, Agent, or Firm — Venable LLP

(57) ABSTRACT

The present disclosure relates to a process solution composition for polymer treatment comprising: a fluorine compound; a ketone-based solvent; and a polar aprotic solvent, wherein the ketone-based solvent is one or more selected from the group consisting of compounds represented by Chemical Formula 1 or Chemical Formula 2, and has an effect capable of preventing damage to various types of metals while improving the power of removing an adhesive polymer remaining on the wafer circuit surface in a semiconductor manufacturing process.

7 Claims, No Drawings

(56) References Cited

FOREIGN PATENT DOCUMENTS

| | | |
|---|---|---|
| KR | 10-2014-0060389 A | 5/2014 |
| KR | 20150016430 A | 2/2015 |
| KR | 10-2016-0039945 A | 4/2016 |
| KR | 10-2016-0073288 A | 6/2016 |
| KR | 20160070385 A | 6/2016 |
| KR | 20160070386 A | 6/2016 |
| KR | 10-20160087089 A | 7/2016 |
| KR | 10-20160101511 A | 8/2016 |
| KR | 10-2017-0015452 A | 2/2017 |
| KR | 102192954 B1 | 12/2020 |
| TW | 200641562 A | 12/2006 |
| TW | 202106865 A | 2/2021 |
| WO | 2007120259 A2 | 10/2007 |
| WO | 2008080097 A2 | 7/2008 |
| WO | 2008157345 A2 | 12/2008 |
| WO | 2010039936 A2 | 4/2010 |
| WO | 2009/013987 A | 9/2010 |
| WO | 2020235605 A1 | 11/2020 |

\* cited by examiner

PROCESS SOLUTION COMPOSITION FOR POLYMER TREATMENT COMPRISING A FLUORINE COMPOUND, A KETONE SOLVENT, AND A POLAR APROTIC SOLVENT

CROSS-REFERENCE TO RELATED APPLICATION(S)

This application claims priority to Korean Patent Application No. 10-2021-0033882, filed on Mar. 16, 2021, the disclosure of which is incorporated herein by reference in its entirety.

BACKGROUND

Technical Field

The present disclosure relates to a process solution composition for polymer treatment capable of minimizing damage to a metal layer while improving the power of removing an adhesive polymer.

Description of the Related Art

In the manufacturing process of a semiconductor element, after an electronic circuit, etc. are formed on the surface of a semiconductor wafer (hereinafter also referred to as a 'wafer'), back grinding of the wafer may be performed in order to reduce the thickness of the wafer. In this case, for the purposes of protection of a circuit surface of the wafer, fixing of the wafer, etc., a support is usually attached to the circuit surface of the wafer with an adhesive polymer such as a silicone polymer or the like being interposed therebetween. When the support is attached to the circuit surface of the wafer, it is possible to reinforce the wafer whose thickness has been reduced after back grinding of the wafer, and a back electrode, etc. may also be formed on the grinding surface of the wafer.

When a process such as the back grinding of the wafer, the formation of the back electrode, or the like is completed, the support is removed from the circuit surface of the wafer, the adhesive polymer is peeled off and removed, and the wafer is cut to manufacture chips.

Meanwhile, a chip stacking technique using a through electrode (e.g., a silicon through electrode) installed through a wafer has recently been developed. According to this chip stacking technique, the electronic circuits of a plurality of chips are electrically connected by using through electrodes instead of conventional wires. Therefore, it is possible to promote high integration of the chips and speed up of the operation. When this chip stacking technique is used, in many cases, the back grinding of the wafer is performed in order to reduce the thickness of an assembly in which a plurality of chips are stacked, and thus, an opportunity of using a support or an adhesive polymer increases.

However, since after the support is generally attached to the circuit surface of the wafer with the adhesive polymer being interposed therebetween, thermal curing is performed for firm attachment of the wafer and the support. When the adhesive polymer is peeled off, the cured adhesive polymer may remain on the support and the circuit surface of the wafer occurs. Therefore, there is a need for a means capable of preventing damage to the wafer or a metal film while efficiently removing the cured adhesive polymer remaining on the wafer circuit surface.

Meanwhile, U.S. Pat. No. 6,818,608 is an invention related to a composition for dissolving a curable polymer resin, comprising (a) an organic-fluorine component, (b) a soluble amine component, and a solvent for the components a and b. However, according to the above literature, there are problems in that ER drop occurs over time due to the use of an amine compound, the removal rate for the reticulated polymer is slow or the removal properties of the linear polymer are decreased, and damage to the metal layer occurs.

RELATED ART DOCUMENT

Patent Document (Patent Document 1) U.S. Pat. No. 6,818,608

SUMMARY

The present disclosure is to improve the problems of the conventional art described above, and an object of the present disclosure is to provide a process solution for polymer treatment that can minimize damage to the metal layer and exhibit excellent phase stability while removing, at an excellent speed without any residue, adhesive polymers such as reticulated polymers and linear polymers remaining on the wafer circuit surface in the semiconductor manufacturing process.

However, the problems to be solved by the present application are not limited to the problems mentioned above, and other problems not mentioned will be clearly understood by those with ordinary skill in the art from the following description.

The present disclosure provides a process solution composition for polymer treatment comprising: a fluorine compound; a ketone-based solvent; and a polar aprotic solvent, wherein the ketone-based solvent is one or more selected from the group consisting of compounds represented by Chemical Formula 1 below or Chemical Formula 2 below.

[Chemical Formula 1]

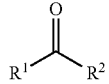

(In Chemical Formula 1,
$R^1$ and $R^2$ are each independently a $C_1$-$C_{18}$ linear or branched hydrocarbon group or a $C_3$-$C_{18}$ cycloaliphatic hydrocarbon group, and $R^1$ and $R^2$ may form a ring.)

[Chemical Formula 2]

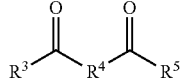

(In Chemical Formula 2,
$R^3$ and $R^5$ are each independently a $C_1$-$C_{18}$ linear or branched aliphatic hydrocarbon group or a $C_3$-$C_{18}$ cycloaliphatic hydrocarbon group, and
$R^4$ is a $C_1$-$C_{18}$ linear or branched divalent aliphatic hydrocarbon group.)

In an embodiment, the ketone-based solvent may include a compound having the sum of carbon atoms of 3 or more and 30 or less.

In an embodiment, the ketone-based solvent and the polar aprotic solvent may have a mixing ratio of 1:9 to 9:1.

In an embodiment, the mixed solvent of the ketone-based solvent and the polar aprotic solvent may have a Hansen solubility parameter value range satisfying the following.

$\delta_D$: 15.5 to 19.0 [MPa$^{1/2}$]
$\delta_P$: 7.5 to 15.5 [MPa$^{1/2}$]
$\delta_H$: 4.5 to 9.5 [MPa$^{1/2}$]

In an embodiment, the ketone-based solvent may be one or more selected from 2-butanone, dicyclopropyl ketone, cyclopropyl methyl ketone, cyclopentanone, cyclohexanone, cycloheptanone, 3-pentanone, 2-pentanone, 3-methyl-2-pentanone, acetylacetone, 4-methyl-2-pentanone, 2-methyl-3-pentanone, 3-hexanone, 2-hexanone, dicycloketone, 1-cyclopentylethanone, 3-methyl-2-hexanone, 2-methyl-3-hexanone, isoamyl ketone, amyl ketone, 4-heptanone, 3-heptanone, 2-heptanone, 5-nonanone, 2,4-dimethyl-3-pentanone, ethyl isobutyl ketone, 3,5-dimethylcyclohexanone, 2,6-dimethylcyclohexanone, 3-octanone, 5-methyl-2-hexanone, 5-methyl-3-heptanone, 3-methyl-4-heptanone, 2,5-dimethyl-3-hexanone, 2,6-dimethyl-4-hexanone, 2-undecanone, and 2,6-dimethyl-4-heptanone.

In an embodiment, the fluorine compound may be one or more selected from alkylammonium fluoride, alkylphosphonium fluoride, and alkylsulfonium fluoride.

In an embodiment, the polar aprotic solvent may be one or more selected from an amide-based solvent, a morpholine-based solvent, a pyrrolidine-based solvent, a pyrrolidone-based solvent, a urea-based solvent, a lactone-based solvent, a sulfoxide-based solvent, a phosphate-based solvent, an oxazolidone-based solvent, and a piperazine-based solvent.

In an embodiment, the process solution composition for polymer treatment may comprise: 0.1 to 30% by weight of the fluorine compound; 5 to 90% by weight of the ketone-based solvent; and the balance of the polar aprotic solvent based on the total weight of the composition.

In an embodiment, the process solution composition for polymer treatment may remove a reticulated polymer and a linear polymer.

Advantageous Effects

The present disclosure provides a process solution composition for polymer treatment capable of preventing damage to a metal layer while improving the power of removing an adhesive polymer remaining on the wafer circuit surface in a semiconductor manufacturing process. Specifically, the process solution composition for polymer treatment according to the present disclosure exhibits a synergistic effect with a polar aprotic solvent when using a ketone-based solvent of a specific structure, and thus can remove the reticulated polymer and the linear polymer at an excellent rate without residue, minimize bump damage, prevent damage to metal layers such as Ni, Cu, and Al, and exhibit excellent phase stability.

DESCRIPTION OF SPECIFIC EMBODIMENTS

The present disclosure relates to a process solution composition for polymer treatment comprising a fluorine compound, a ketone-based solvent, and a polar aprotic solvent, and the process solution composition for polymer treatment can prevent damage to metal while improving the power of removing an adhesive polymer remaining on the semiconductor wafer circuit surface or metal layer.

The adhesive polymer includes a silicone-based resin, and may include not only a linear non-reactive polydimethylsiloxane-based polymer, but also a polyorganosiloxane resin that forms a reticulated polymer through curing.

The process solution composition for polymer treatment in the present disclosure includes a polymer cleaning solution, a polymer stripping solution, and a polymer etching solution, and the polymer cleaning solution is most preferable.

Throughout the present specification, the term "alkyl group" refers to a hydrocarbon group connected by a single bond.

Process Solution Composition for Polymer Treatment

The process solution composition for polymer treatment according to the present disclosure may comprise: a fluorine compound; a ketone-based solvent; and a polar aprotic solvent, and may further comprise other additives. The process solution composition for polymer treatment according to the present disclosure comprises both a ketone-based solvent having a specific chemical formula structure and a polar aprotic solvent in the fluorine compound, and in particular, the process solution composition is characterized by exhibiting a synergistic effect with the polar aprotic solvent when a ketone-based solvent having a specific structure is used.

In the present disclosure, the solubility parameter may be adjusted by adjusting the ratio of the above two types of solvents, and particularly, the effect of the present disclosure is improved when the solubility parameter range is satisfied.

In the present disclosure, it is more preferable that the ketone-based solvent and the polar aprotic solvent have a mixing ratio of 1:9 to 9:1, and the mixed solvent having the mixing ratio of 1:9 to 9:1 has a Hansen solubility parameter value range satisfying the following conditions.

$\delta_D$: 15.5 to 19.0 [MPa$^{1/2}$]
$\delta_P$: 7.5 to 15.5 [MPa$^{1/2}$]
$\delta_H$: 4.5 to 9.5 [MPa$^{1/2}$]

Throughout the present specification, $\delta_D$ means a solubility parameter according to dispersion force, $\delta_P$ means a solubility parameter according to dipole-dipole attraction, and $\delta_H$ means a solubility parameter according to hydrogen bonding force.

The Hansen solubility parameter value of the mixed solvent may be calculated from the volume fraction of each constituent solvent through the following equation.

$$\delta_{blend} = \Sigma[\phi component_n \times \delta component_n]$$

When the ketone-based solvent and the polar aprotic solvent of the present disclosure are mixed at a certain ratio, the mixed solvent plays a role of inhibiting corrosion to the metal film exposed during cleaning by suppressing hydrogen bonding between the water molecule and the fluorine compound present in the composition.

Further, a process solution for polymer treatment according to the present disclosure is one into which water is not artificially injected, and one which does not substantially contain water is preferable. However, if necessary, a hydrate of the fluorine compound may be used, and accordingly, it may contain a small amount of water. In this case, the small amount of water may be contained in an amount of less than 4% by weight based on the total weight of the composition, and when water is arbitrarily injected, there may be problems in that the removal properties of polymers such as silicone resin and the like are reduced, and damage to the metal film is increased.

Further, it is preferable that the process solution for polymer treatment according to the present disclosure does not comprise a compound including a hydroxide (—OH) group in the molecular structure, such as an alcohol-based compound. When a hydroxide group is included in the molecular structure, there may be a problem in that the activity of the fluorine compound is inhibited to drop the removal properties of the silicone resin.

(a) Fluorine Compound

The process solution for polymer treatment according to the present disclosure comprises one or more fluorine-based compounds, and the fluorine-based compounds serve to reduce the molecular weight by breaking the ring of the silicone polymer.

The fluorine-based compound of the present disclosure may include one or more compounds selected from the group consisting of alkylammonium fluoride, alkylphosphonium fluoride, and alkylsulfonium fluoride.

The alkylammonium fluoride may include a compound represented by the following Chemical Formula 3 or 4:

[Chemical Formula 3]

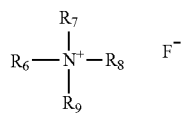

In Chemical Formula 3, $R_6$ to $R_9$ are each independently an alkyl group having 3 to 10 carbon atoms. When $R_6$ to $R_9$ are each independently an alkyl group having 2 or less carbon atoms, the solubility of the fluorine-based compound in the solvent is dropped so that there may be a problem in that precipitation occurs immediately after mixing, or precipitation occurs after some time has elapsed.

[Chemical Formula 4]

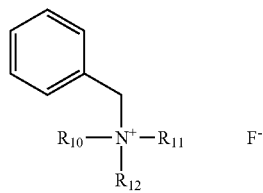

In Chemical Formula 4, $R_{10}$ to $R_{12}$ are each independently an alkyl group having 1 to 10 carbon atoms.

Examples of the alkylammonium fluoride may include tetrabutylammonium bifluoride (TBAF.HF), tetrabutylammonium fluoride (TBAF), tetraoctylammonium fluoride (TOAF), benzyltrimethylammonium fluoride (BTMAF), and the like, but are not limited thereto.

Further, the alkylammonium fluoride may exist in the form of a hydrate such as alkylammonium fluoride.n (H$_2$O), where n is an integer of 5 or less. Examples of the alkylammonium fluorides may include tetra-n-butylammonium fluoride hydrate, tetra-n-butylammonium fluoride trihydrate, benzyltrimethylammonium fluoride hydrate, and the like, but are not limited thereto.

Further, the alkylphosphonium fluoride may include a compound represented by the following Chemical Formula 5:

[Chemical Formula 5]

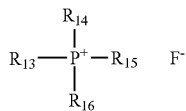

In Chemical Formula 5, $R_{13}$ to $R_{16}$ are each independently an aliphatic hydrocarbon having 1 to 22 carbon atoms or an aromatic hydrocarbon having 6 to 20 carbon atoms.

Examples of the alkylphosphonium fluoride may include tetrabutylphosphonium fluoride, triethyloctylphosphonium fluoride, cetyltrimethylphosphonium fluoride, and the like, but are not limited thereto.

Further, the alkylsulfonium fluoride may include a compound represented by the following Chemical Formula 6:

[Chemical Formula 6]

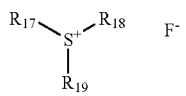

In Chemical Formula 6, $R_{17}$ to $R_{19}$ are each independently an aliphatic hydrocarbon having 1 to 22 carbon atoms or an aromatic hydrocarbon having 6 to 20 carbon atoms.

Examples of the alkylsulfonium fluoride may include tributylsulfonium fluoride, trioctylsulfonium fluoride, n-octyldimethylsulfonium fluoride, and the like, but are not limited thereto.

The fluorine compound is contained in an amount of 0.1 to 30% by weight, preferably 0.5 to 20% by weight, based on the total weight of the process solution composition for polymer treatment. When the fluorine compound is contained in an amount of less than 0.1% by weight, there may be a problem in that the silicone-based resin attached to electronic parts and the like cannot be effectively removed, and when it is contained in an amount exceeding 30% by weight, the moisture content increases with time, which causes a concern about a decrease in the removal performance of the silicone resin, and there may be a problem in that it is difficult to control corrosion of the metal film due to an increase in fluoride.

(b) Ketone-Based Solvent

In the present disclosure, the ketone-based solvent can serve to expand the silicone polymer and dissolve the fluorine compound and the decomposed silicone polymer, and improve the corrosion inhibitory effect on various types of metals through combination with a polar aprotic solvent, which will be described later. In particular, the ketone-based solvent having a specific structure according to the present disclosure plays an outstanding role of improving the permeability into the surface of the silicone polymer cured by UV or heat.

The ketone-based solvent may be one or more selected from the group consisting of compounds represented by Chemical Formula 1 below or Chemical Formula 2 below. The ketone-based solvent of the present disclosure has a dipole moment due to the lone pair of electrons of the alkyl group (hydrocarbon group) and the oxygen atom at both sides centering around the ketone functional group. The ketone-based solvent ensures the reactivity of the nucleophile using a polar aprotic solvent that does not form a hydrogen bond with the nucleophile and additionally generates the interaction due to the polarization phenomenon of the corresponding nucleophile and the ketone group so that it serves to inhibit the nucleophile from forming a bonding form causing corrosion. This effect is exhibited by a ketone-based solvent having a specific structure among the ketone-based solvents.

[Chemical Formula 1]

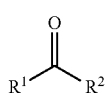

In Chemical Formula 1, $R^1$ and $R^2$ are each independently a $C_1$-$C_{18}$ linear or branched hydrocarbon group or a $C_3$-$C_{18}$ cycloaliphatic hydrocarbon group, and $R^1$ and $R^2$ may form a ring. $R^1$ and $R^2$ may be the same as or different from each other, and more preferably the same as each other.

[Chemical Formula 2]

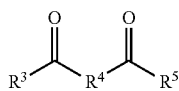

In Chemical Formula 2, $R^3$ and $R^5$ are each independently a $C_1$-$C_{18}$ linear or branched aliphatic hydrocarbon group or a $C_3$ to $C_{18}$ cycloaliphatic hydrocarbon group, and $R^4$ is a $C_1$-$C_{18}$ linear or branched divalent aliphatic hydrocarbon group. $R^3$ and $R^5$ may be the same as or different from each other, and more preferably the same as each other.

The ketone-based solvent preferably includes compounds having the sum of carbon atoms of 3 or more and 30 or less, and a compound having the sum of carbon atoms of 3 or more and 10 or less among them is more preferable in consideration of dissolution of the fluorine compound, miscibility with the polar aprotic solvent, and permeability into the silicone polymer. In particular, the ketone-based solvent is more preferable in terms of phase stability when the structure of Chemical Formula 1 or 2 above is symmetrical. For example, the compound represented by Chemical Formula 1 above is preferably symmetrical around the ketone functional group, and the compound represented by Chemical Formula 2 above is preferably symmetrical around $R^4$.

Examples of the ketone-based solvent may include 2-butanone, 3-methyl-2-butanone, dicyclopropyl ketone, cyclopropyl methyl ketone, cyclopentanone, cyclohexanone, cycloheptanone, 3-pentanone, 2-pentanone, 3-methyl-2-pentanone, acetylacetone, 4-methyl-2-pentanone, 2-methyl-3-pentanone, 3-hexanone, 2-hexanone, 1-cyclopentylethanone, 3-methyl-2-hexanone, 2-methyl-3-hexanone, isoamyl ketone, amyl ketone, 4-heptanone, 3-heptanone, 2-heptanone, 5-nonanone, 2,4-dimethyl-3-pentanone, ethyl isobutyl ketone, 3,5-dimethylcyclohexanone, 2,6-dimethylcyclohexanone, 3-octanone, 5-methyl-2-hexanone, 5-methyl-3-heptanone, 3-methyl-4-heptanone, 2,5-dimethyl-3-hexanone, 2,6-dimethyl-4-hexanone, 2-undecanone, 2,6-dimethyl-4-heptanone, etc., and preferably include 2-butanone, 3-methyl-2-butanone, dicyclopropyl ketone, cyclopropyl methyl ketone, cyclopentanone, cycloheptanone, 3-pentanone, acetylacetone, 4-heptanone, 5-nonanone, 5-methyl-2-hexanone, 2,6-dimethyl-4-heptanone, etc., but the examples thereof are not limited thereto.

The ketone-based solvent is contained in an amount of 5 to 90% by weight, preferably 10 to 85% by weight, based on the total weight of the process solution composition for polymer treatment. When the ketone-based solvent is contained in an amount of less than 10% by weight, the effect of the fluorine compound inhibiting corrosion of the metal film becomes insufficient, and additionally, it is difficult to achieve the target removal properties due to insufficient permeability into the silicone polymer. When the ketone-based solvent is contained in an amount exceeding 90% by weight, there may be a problem in that corrosion of the metal film cannot be inhibited.

(c) Polar Aprotic Solvent

The polar aprotic solvent serves to expand the silicone polymer and dissolve the fluorine compound and the decomposed silicone polymer, and particularly, the corresponding solvent plays an outstanding role of dissolving a silicone oligomer decomposed by the fluorine compound.

The polar aprotic solvent may be contained in the remaining amount excluding the ketone-based solvent and the fluorine compound based on the total weight of the process solution composition for polymer treatment.

Examples of the polar aprotic solvent may include an amide-based solvent, a pyridine-based solvent, a morpholine-based solvent, a pyrrolidine-based solvent, a pyrrolidone-based solvent, a urea-based solvent, a lactone-based solvent, a sulfoxide-based solvent, a phosphate-based solvent, an oxazolidone-based solvent, a piperazine-based solvent, etc. Among them, more preferable examples thereof include an amide-based solvent, a pyridine-based solvent, a pyrrolidone-based solvent, a lactone-based solvent, a sulfoxide-based solvent, a phosphate-based solvent, and an oxazolidone-based solvent.

Examples of the amide-based solvent may include N,N-dimethylformamide, N,N-diethylformamide, N,N-dipropylformamide, N,N-dimethylacetamide, N,N-diethylacetamide, N,N-dipropylacetamide, N-ethyl-N-methylacetamide, N,N-dimethylpropionamide, N,N-dimethylbutyramide, N,N-dimethylisobutyramide, N,N-dimethylpentanamide, N,N-dimethylpropanamide, N,N-diethylpropanamide, N,N-dibutylpropanamide, and the like, but are not limited thereto.

The pyridine-based solvent may include a compound represented by the following Chemical Formula 7:

[Chemical Formula 7]

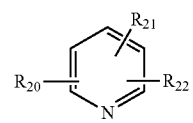

In Chemical Formula 7, $R_{20}$ to $R_{22}$ may be each independently hydrogen, a $C_1$-$C_{10}$ linear or branched aliphatic hydrocarbon group, a halogen (e.g., F, Cl, Br, or I), an aldehyde group (—CHO—), an acetaldehyde group (—COCH$_3$), a $C_1$-$C_4$ alkoxy group, a vinyl group, an acetylene group, a cyano group (—CN), or a methylsulfide group (—SCH$_3$).

Examples of the pyridine-based solvent may include pyridine, 2-methylpyridine, 3-methylpyridine, 4-methylpyridine, 4-ethylpyridine, 4-propylpyridine, 4-isopropylpyridine, 4-amylpyridine, 2,3-Lutidine, 2,4-Lutidine, 2,5-Lutidine, 3,4-Lutidine, 3,5-lutidine, 2,4,6-trimethylpyridine, and the like, but are not limited thereto.

The morpholine-based solvent may include a compound represented by the following Chemical Formula 8:

[Chemical Formula 8]

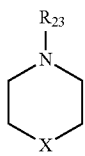

[Chemical Formula 10]

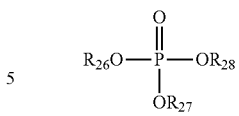

In Chemical Formula 8, $R_{23}$ is hydrogen; a $C_1$-$C_6$ linear or branched aliphatic hydrocarbon group; a vinyl group; a cyano group (—CN); a $C_1$-$C_4$ aliphatic hydrocarbon group substituted with a tertiary amine; or a phenyl group or a pyridine group which is substituted with a $C_1$-$C_4$ alkyl group, a cyano group (—CN), a halogen group (e.g., F, Cl, Br, or I), or an aldehyde group (—CHO), X is oxygen or —$NR_{24}$—, and $R_{24}$ is a $C_1$-$C_4$ aliphatic hydrocarbon group.

Examples of the morpholine-based solvent may include N-methylmorpholine, N-ethylmorpholine, N-arylmorpholine, N-butylmorpholine, N-isobutylmorpholine, and the like, but are not limited thereto.

Examples of the pyrrolidine-based solvent may include 1-ethylpyrrolidine, 1-propylpyrrolidine, 1-butylpyrrolidine, tert-butyl pyrrolidine, 1-(1-phenylpentan-2-yl)pyrrolidine, 1-(1-cyclohexen-1-yl)pyrrolidine, and the like, but are not limited thereto.

Examples of the pyrrolidone-based solvent may include N-methylpyrrolidone (NMP), N-ethylpyrrolidone (NEP), N-vinylpyrrolidone (NVP), and the like, but are not limited thereto.

The urea-based solvent may include a compound represented by the following Chemical Formula 9:

[Chemical Formula 9]

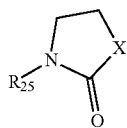

In Chemical Formula 9, X is oxygen or —$NR_{24}$—, and $R_{24}$ and $R_{25}$ are each independently a $C_1$-$C_6$ linear, branched or cycloaliphatic hydrocarbon group; or a $C_1$-$C_4$ aliphatic hydrocarbon group substituted with a vinyl group, a phenyl group, an acetylene group, a methoxy group, or a dimethylamino group.

Examples of the urea-based solvent may include tetramethylurea, tetraethylurea, tetrabutylurea, etc., but are not limited thereto.

Examples of the lactone-based solvent may include beta-butyrolactone, gamma-butyrolactone, gamma-caprolactone, gamma-heptanolactone, gamma-octanolactone, gamma-nonalactone, gamma-decanolactone, delta-caprolactone, delta-heptanolactone, delta-octanolactone, delta-nonalactone, delta-decanolactone, delta-dodecanolactone, etc., but are not limited thereto.

Examples of the sulfoxide-based solvent may include dimethyl sulfoxide (DMSO), dibutyl sulfoxide, diphenyl sulfoxide, dibenzyl sulfoxide, methylphenyl sulfoxide, and the like, but are not limited thereto.

The phosphate-based solvent may include a compound represented by the following Chemical Formula 10:

In Chemical Formula 10, $R_{26}$ to $R_{28}$ are each independently a $C_1$-$C_8$ linear or branched aliphatic hydrocarbon group; a $C_3$-$C_8$ divalent aliphatic hydrocarbon group forming a ring together with adjacent oxygen; a phenyl group unsubstituted or substituted with a $C_1$-$C_4$ aliphatic hydrocarbon group; or a $C_2$-$C_4$ aliphatic hydrocarbon group substituted with halogen (e.g., F, Cl, Br, or I), or a phenyl group substituted with halogen.

Examples of the phosphate-based solvent may include triethyl phosphate, tributyl phosphate, triamyl phosphate, triaryl phosphate, etc., but are not limited thereto.

Examples of the oxazolidone-based solvent may include 2-oxazolidone, 3-methyl-2-oxazolidone, etc., but are not limited thereto.

Examples of the piperazine-based solvent may include dimethylpiperazine, dibutylpiperazine, etc., but are not limited thereto.

(d) Other Additives

The process solution composition for polymer treatment according to the present disclosure may further comprise, in addition to the above components, components such as a corrosion inhibitor, a surfactant, etc. commonly used in this field in the range that does not impair the polymer removal performance of the process solution for polymer treatment according to the present disclosure.

The corrosion inhibitor is used to effectively inhibit corrosion of the metal-containing lower film when the resin is removed, and is generally commercially available from various sources and may be used without further purification.

The surfactant may be used to enhance cleaning properties. For example, an anionic surfactant, a cationic surfactant, and a nonionic surfactant may be used, but among them, it is particularly preferable to use a nonionic surfactant having excellent wettability and less bubble generation, and these surfactants may be used alone or in a mixture of two or more thereof.

When the process solution composition for polymer treatment according to the present disclosure is used, in the process of making a semiconductor substrate thin by forming a silicone adhesive and a silicone release layer between a carrier wafer and a device wafer in order to make the device wafer thin, the silicon release layer is separated in the process of removing the carrier wafer after the process and thus not cause damage to the device wafer. The silicone adhesive serves to bond the device wafer and the carrier wafer, and may be subjected to a curing process.

Further, the process solution composition for polymer treatment according to the present disclosure is used for removing silicone residues on the device wafer in the above process, and the removal target of the process solution composition for polymer treatment according to the present disclosure may be a silicone-based resin, may be one or more of a reticulated polymer and a linear polymer, and specifically includes not only a linear non-reactive polydimethylsiloxane-based polymer, but also a polyorganosiloxane resin that forms a reticulated polymer through curing.

Further, the present disclosure provides a method for removing a polymer from a device by using the process solution composition for polymer treatment according to the present disclosure. All of the contents described for the process solution composition for polymer treatment according to the present disclosure may be applied to the method for removing a polymer according to the present disclosure, and detailed descriptions of overlapping parts have been omitted, but even if the descriptions have been omitted, the described contents may be equally applied thereto.

Specifically, the polymer removal method is for removing a polymer such as a silicone adhesive used in the process of making a device wafer thin, and the process of making the device wafer thin includes a process of making a semiconductor substrate thin by forming a silicone adhesive and a silicone release layer between a carrier wafer and the device wafer. The silicone release layer is separated in the process of removing the carrier wafer after the process and thus does not cause damage to the device wafer. The silicone adhesive serves to bond the device wafer and the carrier wafer, and is subjected to a curing process. Such a polymer cured after the process is removed using the process solution composition for polymer treatment according to the present disclosure.

Hereinafter, the present disclosure will be described in more detail using Examples and Comparative Examples. However, the following Examples are intended to illustrate the present disclosure, and the present disclosure is not limited by the following Examples, and may be variously modified and changed. The scope of the present disclosure will be determined by the technical spirit of the claims to be described later.

Examples 1 to 15 and Comparative Examples 1 to 5: Preparation of Process Solution Compositions for Polymer Treatment Process solution compositions for polymer treatment were prepared according to the components and composition ratios shown in Table 1 below.

Fluorine Compounds
  A) TBAF.HF: tetrabutylammonium bifluoride
  B) TBAF: tetrabutylammonium fluoride trihydrate
  C) BTMAF: benzyltetramethylammonium fluoride hydrate
  D) Tetrabutylphosphonium fluoride
  E) tributylsulfonium fluoride Further, Hansen solubility parameter values of the process solution compositions for polymer treatment in Examples 1 to 15 and Comparative Examples 1 to 5 above are summarized in Table 2 below.

TABLE 2

| | Solubility parameter [MPa$^{1/2}$] | | |
|---|---|---|---|
| | $\delta_D$ | $\delta_P$ | $\delta_H$ |
| Example 1 | 16.35 | 10.88 | 7.14 |
| Example 2 | 16.26 | 10.03 | 6.41 |
| Example 3 | 16.13 | 8.90 | 5.44 |
| Example 4 | 16.04 | 8.04 | 4.69 |
| Example 5 | 16.33 | 10.95 | 8.66 |
| Example 6 | 17.21 | 11.12 | 6.65 |
| Example 7 | 17.84 | 13.60 | 6.68 |
| Example 8 | 17.75 | 11.84 | 5.71 |
| Example 9 | 16.06 | 12.14 | 5.22 |
| Example 10 | 17.71 | 11.17 | 6.72 |
| Example 11 | 17.45 | 8.23 | 5.13 |
| Example 12 | 16.01 | 8.30 | 5.14 |
| Example 13 | 15.53 | 10.16 | 5.91 |
| Example 14 | 18.93 | 16.22 | 7.17 |
| Example 15 | 16.2 | 6.34 | 9.59 |
| Comparative Example 1 | 16.00 | 7.70 | 4.40 |
| Comparative Example 2 | 16.40 | 11.30 | 7.50 |
| Comparative Example 3 | 15.30 | 18.00 | 6.10 |
| Comparative Example 4 | 16.13 | 9.13 | 11.15 |
| Comparative Example 5 | 17.44 | 11.75 | 7.18 |

TABLE 11

| (Unit: % by weight) | Fluorine compound | | Ketone-based solvent | | Other solvents | |
|---|---|---|---|---|---|---|
| | Type | Content | Type | Content | Type | Content |
| Example 1 | A | 5 | 5-nonanone | 10 | Diethyl acetamide | 85 |
| Example 2 | B | 8 | 5-nonanone | 30 | Diethyl acetamide | 62 |
| Example 3 | B | 6 | 5-nonanone | 60 | Diethyl acetamide | 34 |
| Example 4 | B | 5 | 5-nonanone | 85 | Diethyl acetamide | 10 |
| Example 5 | D | 8 | 3-pentanone | 10 | Diethylformamide | 82 |
| Example 6 | E | 8 | Acetylacetone | 40 | Ethyl pyrrolidone | 52 |
| Example 7 | B | 5 | 2-butanone | 30 | Gamma-butyrolactone | 65 |
| Example 8 | B | 7 | Cyclopentanone | 80 | Triethyl phosphate | 13 |
| Example 9 | C | 7 | 3-pentanone | 30 | Dimethylpropanamide | 63 |
| Example 10 | B | 10 | 4-heptanone | 10 | Ethylpyrrolidone | 80 |
| Example 11 | B | 5 | 5-nonanone | 40 | Pyridine | 45 |
| Example 12 | B | 4 | 3-pentanone | 86 | Dimethyl sulfoxide | 10 |
| Example 13 | B | 4 | 2-undecanone | 20 | Ethylpyrrolidone | 76 |
| Example 14 | B | 7 | Cyclopentanone | 5 | Gamma-butyrolactone | 88 |
| Example 15 | B | 5 | 2-heptanone | 85 | Dimethylpropanamide | 10 |
| Comparative Example 1 | B | 8 | 5-nonanone | 92 | — | — |
| Comparative Example 2 | B | 10 | — | — | Diethylacetamide | 90 |
| Comparative Example 3 | B | 6 | — | — | Acetonitrile | 94 |
| Comparative Example 4 | A | 10 | 2-butanone | 30 | Ethylene glycol monoethyl ether | 60 |
| Comparative Example 5 | B | 10 | — | — | N-ethylpyrrolidone Diethyl acetamide | 60 30 |

EXPERIMENTAL EXAMPLE

For the process solution compositions for polymer treatment in Examples and Comparative Examples above, respective experiments were carried out in the following manner, and the results are shown in Table 3 below.

Experimental Example 1: Removal Property Evaluation 1 of Thin Film Substrate (Reticulated Polymer)

A wafer coated with a cured silicone polymer having a thickness of 50 μm was cut to a size of 2×2 cm² and the cut wafers were used, and while the composition solution at 25° C. was rotated at 400 rpm, the prepared samples were immersed therein for 1 minute, washed with IPA, and then dried. After evaluation, the thickness values of the cured silicone polymer films were measured by a scanning electron microscope (SEM). Then, after the thickness values of the remaining silicone-based resin films were measured by an SEM, the removal speeds were calculated as in Equation 1 below and are summarized in Table 3 below according to the following evaluation criteria.

Removal speed (μm/min)=[Thickness before evaluation (μm)−Thickness after evaluation (μm)]/ Evaluation time (min)   [Equation 1]

Evaluation Criteria
○: Removal speed of 20 μm/min or higher
Δ: removal speed of 10 μm/min or higher and lower than 20 μm/min
x: Removal speed of lower than 10 μm/min

Experimental Example 2: Removal Property Evaluation 2 of Thin Film Substrate (Linear PDMS)

A silicon wafer was spin-coated with a blend obtained by mixing a polydimethylsiloxane prepolymer and a curing agent at a predetermined mass ratio, and cut to a size of 2×2 cm², and the cut wafers were used, and while the composition solution at 25° C. was rotated at 400 rpm, the prepared samples were immersed therein for 1 minute, washed with IPA, and then dried. After evaluation, the residues on the wafer surface were observed with an optical microscope and SEM.

According to whether the residues were generated or not, the observation results are shown in Table 3 below.
Evaluation Criteria
○: No residues
x: Residues

Experimental Example 3: Evaluation 1 of Metal Film Corrosion (Bump Ball Damage)

The metal for which the process solution compositions for polymer treatment according to the present disclosure exhibits an anticorrosive effect may be Sn, Sn alloys including a Sn—Ag alloy, a Sn—Au alloy, and a Sn—Ag—Cu alloy, a double or triple-layered metal film composed of Sn/Cu, Sn/Ni, Sn/Ni/Cu, Sn—Ag/Cu, Sn—Ag/Ni, Sn—Ag/Ni/Cu, Sn—Au/Cu, Sn—Au/Ni, Sn—Au/Ni/Cu, Sn—Ag—Cu/Ni, Sn—Ag—Cu/Ni/Cu, Sn—Ag—Cu/Cu, or the like, or a metal film composed of Cu alone, but is not limited thereto.

A wafer on which bump balls formed of typically Sn—Ag/Cu had been formed was cut to a size of 2×2 cm² and the cut wafers were used, and while the composition solution at 25° C. was rotated at 400 rpm, the prepared samples were immersed therein for 60 minutes, washed with IPA, and then dried. After evaluation, the numbers of bump ball damages were confirmed with SEM, and the numbers of damage occurrences were summarized in Table 3 below based on the following criteria.
Evaluation Criteria
○: less than 5
Δ: 5 or more and less than 20
x: 20 or more

Experimental Example 4: Metal Film Corrosion Evaluation 2 (Metal Film Damage)

Further, wafers on which a nickel plated film, a copper thin film, and an aluminum thin film had respectively been formed were cut to a size of 2×2 cm² and the cut wafers were used, and while the composition solution at 25° C. was rotated at 400 rpm, the prepared samples were immersed therein for 60 minutes, washed with IPA, and then dried. Further, after evaluation, the pad defects were checked with an optical microscope, and then the checking results are shown in Table 3 below based on the following criteria.
Evaluation Criteria
○: No change or discoloration in surface morphology
Δ: Discoloration
x: Discoloration and change in surface morphology

Experimental Example 5: Phase Stability Evaluation

In order to determine the phase stabilities of mixtures of the fluorine compounds and the solvents, after the mixtures were stored at a condition of 40° C. for 1 week, whether layer separation or precipitation had been occurred or not was further checked, and the checking results were indicated in Table 3 below based on the following criteria.
Evaluation Criteria
○: No problem with phase stability
Δ: Occurrence of precipitation over time
x: Occurrence of layer separation or precipitation

TABLE 3

| Classification | Removal of polymer | | Metal damage | | | | Phase stability |
|---|---|---|---|---|---|---|---|
| | Reticulated | Linear | Bump ball | Ni | Cu | Al | |
| Example 1 | ○ | ○ | ○ | ○ | ○ | ○ | ○ |
| Example 2 | ○ | ○ | ○ | ○ | ○ | ○ | ○ |
| Example 3 | ○ | ○ | ○ | ○ | ○ | ○ | ○ |
| Example 4 | ○ | ○ | ○ | ○ | ○ | ○ | ○ |
| Example 5 | ○ | ○ | ○ | ○ | ○ | ○ | ○ |
| Example 6 | ○ | ○ | ○ | ○ | ○ | ○ | ○ |
| Example 7 | Δ | ○ | Δ | ○ | ○ | ○ | ○ |
| Example 8 | ○ | ○ | ○ | ○ | ○ | ○ | ○ |
| Example 9 | ○ | ○ | ○ | ○ | ○ | ○ | ○ |
| Example 10 | ○ | ○ | ○ | ○ | ○ | ○ | ○ |
| Example 11 | Δ | ○ | ○ | ○ | ○ | ○ | ○ |
| Example 12 | Δ | ○ | ○ | ○ | ○ | ○ | ○ |
| Example 13 | Δ | ○ | Δ | ○ | ○ | ○ | Δ |
| Example 14 | ○ | ○ | Δ | ○ | ○ | ○ | ○ |
| Example 15 | ○ | ○ | Δ | ○ | ○ | ○ | ○ |
| Comparative Example 1 | ○ | ○ | x | Δ | Δ | x | ○ |
| Comparative Example 2 | Δ | ○ | Δ | Δ | Δ | Δ | ○ |
| Comparative Example 3 | x | x | x | Δ | Δ | x | ○ |
| Comparative Example 4 | x | x | x | Δ | Δ | x | ○ |
| Comparative Example 5 | Δ | ○ | x | Δ | Δ | x | ○ |

Referring to Table 2, it can be confirmed that the process solution compositions for polymer treatment in Examples 1 to 15 of the present disclosure exhibit a synergistic effect with the polar aprotic solvent when using the ketone-based solvent having a specific structure and thus can remove the reticulated polymer and the linear polymer without residues at an excellent speed, minimize bump ball damages, prevent damages to metal layers such as Ni, Cu, and Al, and exhibit excellent phase stability.

In contrast, it can be confirmed that Comparative Examples 1 to 5 in which a synergistic effect with the ketone-based solvent and the polar aprotic solvent cannot be expected, had the lowered the polymer removal performance, or damaged the bump balls or the metal layers. Specifically, Comparative Example 1 did not use the polar aprotic solvent and used the ketone-based solvent only, and Comparative Examples 2 and 3 did not use the ketone-based solvent and used the polar aprotic solvent only, and Comparative Examples 1 to 3 all had increased damages to metal. In particular, Comparative Example 3 which is greatly out of the solubility parameter range of the present disclosure, had the significantly low polymer removal performance. Comparative Example 4, which used a general solvent, not the polar aprotic solvent, had the significantly low performance of removing the reticulated and linear polymers, and had increased damage to metal. It could be confirmed that Comparative Example 5 in which two types of polar aprotic solvents were used had the lowered removal performance of the reticulated polymer, and increased damage to the metal.

What is claimed is:

1. A process solution composition for polymer treatment comprising:
   A) 0.1 to 30% by weight of a fluorine compound;
   B) from 5 to 90% by weight of one or more ketone-based solvent represented by the following Chemical Formula 1 or Chemical Formula 2;

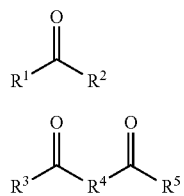

Formula 1

Formula 2 wherein $R^1$ and $R^2$ are each independently a $C_1$-$C_{18}$ linear or branched hydrocarbon group or a $C_3$-$C_{18}$ cycloaliphatic hydrocarbon group;
$R^3$ and $R^5$ are each independently a $C_1$-$C_{18}$ linear or branched aliphatic hydrocarbon group or a $C_3$-$C_{18}$ cycloaliphatic hydrocarbon group; and
$R^4$ is a $C_1$-$C_{18}$ linear or branched divalent aliphatic hydrocarbon group;
   C) less than 4% by weight water; and
   D) one or more polar aprotic solvent(s) selected from the group consisting of:
   i) an amide-based solvent selected from the group consisting of N,N-dimethylformamide, N,N-diethylformamide, N,N-dipropylformamide, N,N-dimethylacetamide, N,N-diethylacetamide, N,N-dipropylacetamide, N-ethyl-N-methylacetamide, N,N-dimethylpropionamide, N,N-dimethylbutyramide, N,N-dimethylisobutyramide, N,N-dimethylpentanamide, N,N-dimethylpropanamide, N,N-diethylpropanamide, and N,N-dibutylpropanamide;
   ii) a morpholine-based solvent selected from the group consisting of N-methylmorpholine, N-ethylmorpholine, N-arylmorpholine, N-butylmorpholine, and N-isobutylmorpholine;
   iii) a pyrrolidine-based solvent selected from the group consisting of 1-ethylpyrrolidine, 1-propylpyrrolidine, 1-butylpyrrolidine, tert-butyl pyrrolidine, 1-(1-phenylpentan-2-yl) pyrrolidine, and 1-(1-cyclohexen-1-yl) pyrrolidine;
   iv) a pyrrolidone-based solvent selected from the group consisting of N-methylpyrrolidone, N-ethylpyrrolidone, and N-vinylpyrrolidone;
   v) a urea-based solvent selected from the group consisting of tetramethylurea, tetraethylurea, and tetrabutylurea;
   vi) a phosphate-based solvent selected from the group consisting of triethyl phosphate, tributyl phosphate, triamyl phosphate, and triaryl phosphate;
   vii) an oxazolidone-based solvent selected from the group consisting of 2-oxazolidone and 3-methyl-2-oxazolidone; and
   viii) a piperazine-based solvent selected from the group consisting of dimethylpiperazine and dibutylpiperazine, wherein other than water, the process solution composition does not comprise a compound comprising a hydroxide group.

2. The process solution composition of claim 1, wherein the ketone-based solvent includes a compound having the sum of carbon atoms of 3 or more and 30 or less.

3. The process solution composition of claim 1, wherein the ketone-based solvent and the polar aprotic solvent have a mixing ratio of 1:9 to 9:1.

4. The process solution composition of claim 1, wherein the mixed solvent of the ketone-based solvent and the polar aprotic solvent has a Hansen solubility parameter value range satisfying the following:
$\delta_D$: 15.5 to 19.0 [MPa$^{1/2}$]
$\delta_P$: 7.5 to 15.5 [MPa$^{1/2}$]
$\delta_H$: 4.5 to 9.5 [MPa$^{1/2}$].

5. The process solution composition of claim 1, wherein the ketone-based solvent is one or more selected from the group consisting of 2-butanone, dicyclopropyl ketone, cyclopropyl methyl ketone, 3-pentanone, 2-pentanone, 3-methyl-2-pentanone, acetylacetone, 4-methyl-2-pentanone, 2-methyl-3-pentanone, 3-hexanone, 2-hexanone, 1-cyclopentylethanone, 3-methyl-2-hexanone, 2-methyl-3-hexanone, isoamyl ketone, amyl ketone, 4-heptanone, 3-heptanone, 2-heptanone, 5-nonanone, 2,4-dimethyl-3-pentanone, ethyl isobutyl ketone, 3-octanone, 5-methyl-2-hexanone, 5-methyl-3-heptanone, 3-methyl-4-heptanone, 2,5-dimethyl-3-hexanone, 2,6-dimethyl-4-hexanone, 2-undecanone, and 2,6-dimethyl-4-heptanone.

6. The process solution composition of claim 1, wherein the fluorine compound is one or more selected from the group consisting of alkylammonium fluoride, alkylphosphonium fluoride, and alkylsulfonium fluoride.

7. The process solution composition of claim 1, wherein the process solution composition for polymer treatment removes a reticulated polymer and a linear polymer.

* * * * *